Figure 1:
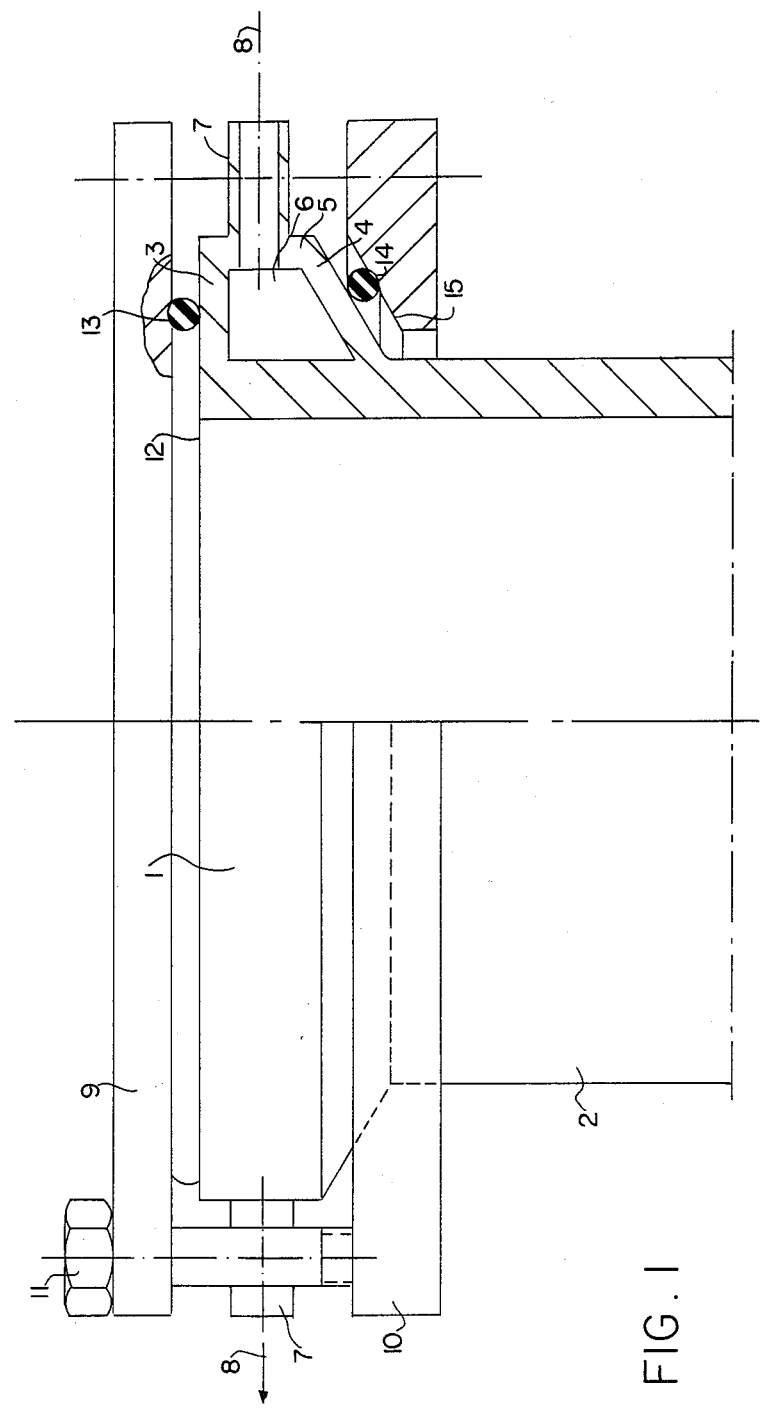

United States Patent [19]

Schülke

[11] Patent Number: 4,778,202

[45] Date of Patent: Oct. 18, 1988

[54] TUBULAR COMPONENT MADE OUT OF QUARTZ GLASS WITH A FLANGE

[75] Inventor: Karl A. Schülke, Neuberg, Fed. Rep. of Germany

[73] Assignee: W. C. Heraeus GmbH, Hanau, Fed. Rep. of Germany

[21] Appl. No.: 53,236

[22] Filed: May 22, 1987

Related U.S. Application Data

[63] Continuation of Ser. No. 850,300, Mar. 12, 1986, abandoned.

[30] Foreign Application Priority Data

May 14, 1985 [WO] World Int. Prop.
O. ............................ PCT/EP85/00225

[51] Int. Cl.⁴ .............................................. F16L 49/00
[52] U.S. Cl. ..................... 285/41; 285/405; 285/911; 285/901; 138/109
[58] Field of Search ............... 285/41, 911, 405, 901; 138/109

[56] References Cited

U.S. PATENT DOCUMENTS

| | | | |
|---|---|---|---|
| 2,061,198 | 11/1936 | Kohut | 285/41 |
| 2,196,766 | 4/1940 | Hascke | 285/41 |
| 3,017,202 | 1/1962 | Swaney | 285/41 |
| 3,771,817 | 11/1973 | Schnabel | 285/901 X |
| 3,984,131 | 10/1976 | Gingvich, Jr. et al. | 285/41 |
| 4,018,215 | 4/1977 | Pei | 285/911 X |
| 4,023,832 | 5/1977 | Legille et al. | 285/41 |
| 4,142,744 | 3/1979 | Bennynek | 285/911 X |
| 4,344,461 | 8/1982 | Beune et al. | 138/109 |
| 4,488,743 | 12/1984 | Schulke | 285/911 X |
| 4,530,378 | 7/1985 | Boog et al. | 285/911 X |

FOREIGN PATENT DOCUMENTS 3020264 12/1981 Fed. Rep. of Germany.

OTHER PUBLICATIONS

Heraeus-Quarzschmelze-Q-C, (filed by applicant).
Heraeus-Quarzschmelze-Q-B, (filed by applicant).

*Primary Examiner*—Thomas F. Callaghan
*Attorney, Agent, or Firm*—Sprung, Horn, Kramer & Woods

[57] ABSTRACT

Tubular components made out of quartz glass or fused quartz, such as tubes, bells, hoods, or pans, with a flange fused or welded onto them are known. To improve cooling such a tubular component, especially the sealing surfaces of the flange, heat conduction and heat radiation in the vicinity of the flange are extensively avoided and, to make it possible to create long-diameter tubular components, the flange is designed hollow and narrow-walled, whereby a coolant, preferably water or a gas, can be conveyed through the hollow space in one preferred embodiment for purposes of interior cooling or the hollow space can be packed with a heat-insulating material.

9 Claims, 5 Drawing Sheets

TUBULAR COMPONENT MADE OUT OF QUARTZ GLASS WITH A FLANGE

This is a continuation of application Ser. No. 850,300, filed Mar. 12, 1986, now abandoned.

The present invention concerns a tubular component made out of quartz glass or fused quartz, such as a tube, a bell, a hood, or a pan, with a flange fused or welded onto it.

A tubular component of this type, which is employed in the manufacture of semiconductors for example, is known from German Offenlegungsschrift No. 3 020 264. The flange on that process tube is thick in relation to the wall of the tube. The flange can be cooled at its radially outside section with coolant, water for example, from a cooling device that is attached at that point and sealed off from the flange with two sealing rings.

Flanging large bells, hoods, pans, and tubes made out of quartz glass or fused quartz is generally associated with extremely difficult manufacturing-technology problems due among other reasons to tubes of quartz materials being subject to precise manufacturing tolerances. The tolerance for a tube that is nominally 500 mm wide for instance is ±20 mm. Such tolerances, however, can often not be achieved in conjunction with the requisite precision. The consequence is frequently expensive subsequent mechanical processing or even total rejection on the basis of excessively and uncorrectably low dimensions, especially in the vicinity of the flange.

Another problem occurs in connection with the manufacture of tubular components with large flanges. The source of these manufacturing-technology difficulties is that the conventionally necessary accumulations of mass (frequently up to a thickness of 40 mm or more) in the vicinity of the flange will either not fuse in situ or, when the flange is manufactured separately, cannot be welded on.

Flanges of the conventional type are also limited in application. Quartz pieces are typically employed at high temperatures. Water-cooled metal flanges with resilient sealing components, O rings for example, are frequently employed in this case for mounting in equipment. Water cooling from the metal end is intended to prevent the sealing components from getting to hot. In spite of cooling, however, the conventional flanges will burn or age subject to the effect of heat conduction or even heat radiation as the result of the relatively high accumulation of of mass in the vicinity of the flange.

A liquid seal with ring of liquid metal located in a groove in one of the components that is to be sealed off is known from German Pat. No. 1 237 859.

The state of the art exhibits a number of ways and means of coming to grips and solving the aforesaid problems encountered with large components made out of quartz materials and provided with a flange.

The object of the present invention is to create an appropriate long-diameter, flanged, tubular component in which the sealing surfaces of the flange in particular can be satisfactorily cooled and in which heat conduction and heat radiation in the vicinity of the flange are very extensively avoided.

This object is attained in accordance with the invention in that the flange (1, 16, 22, 0r 26) is hollow and narrow-walled. A coolant can be introduced when necessary into the hollow space between the walls (or the space can be packed with a heat-insulating material).

The narrow walls of the hollow flange avoid an accumulation of mass in its vicinity and hence a high level of heat conduction. Furthermore, any type of coolant can conveniently transport away the heat in the immediate vicinity of the cooling area and terminal section of the tubular component. Another advantage of the invention is that it makes it possible to provide large but narrow-walled equipment components with a flange of appropriate dimensions but without undesirable accumulations of mass, an advantage that is a direct consequence of the high ductility of the narrow-walled material.

Especially desirable is a flange made out of a component with a U-shaped cross-section. A flange of this type can be manufactured and appropriately dimensioned as a separate component. A U-shaped flange component with one longer and one shorter leg has been proven especially satisfactory, with the longer leg at least to some extent overlapping the face of the tubular component. A component made out of fused quartz is known to be very dense and well fused at its inner surface, specifically to 2 to 3 mm deep. The outer region of the wall, however, and hence the outer region of the face of the tubular component, contains many 0.5-mm bubbles or blowholes. Since, however, the U-shaped component is drawn over the face of the tubular component, precisely the regions that exhibit the bubbles are effectively covered up.

A flange of this type will be very strong if the area that connects the two legs of the U-shaped flange component slopes toward the inside of the tube and toward the end of the tube. An angle of inclination of the connecting area to the axis of the tube of about 15° to 30° has been proven satisfactory.

Depending on the diameter of the tubular component and the dimensions of the flange, the walls of the flange should be about 4 to 10 mm thick.

Two connections, one to introduce the coolant and one to remove it, are positioned in a practical way at diametrically opposite locations, preferably in the connecting area. With the cooling system designed along these lines, it is unnecessary to partition the hollow space into inlet and outlet channels. Cooling will occur in the course of flowing through without special additional design measures.

Figure 2:
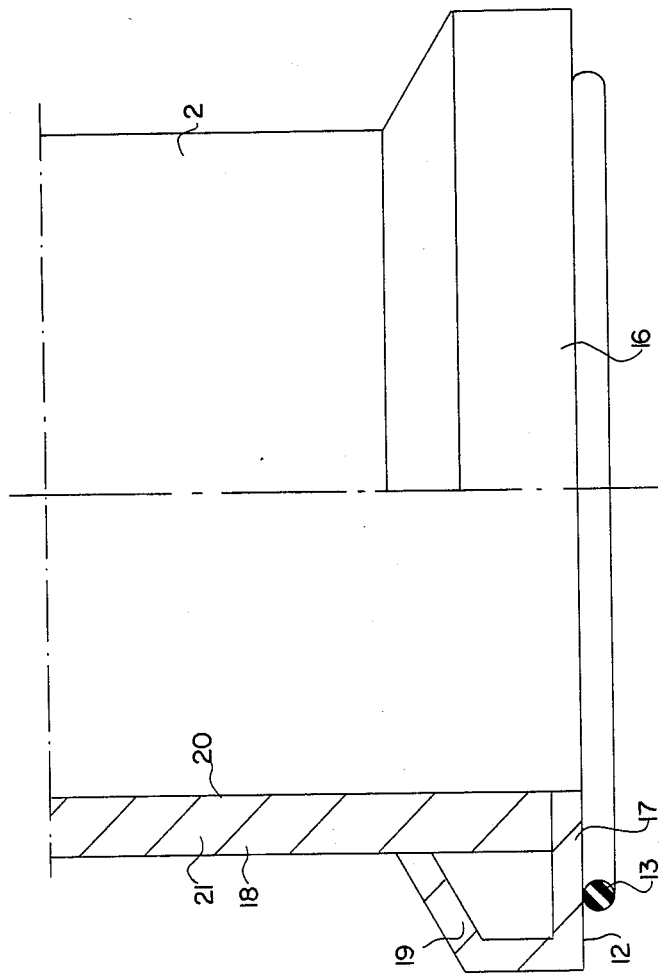
Figure 3:
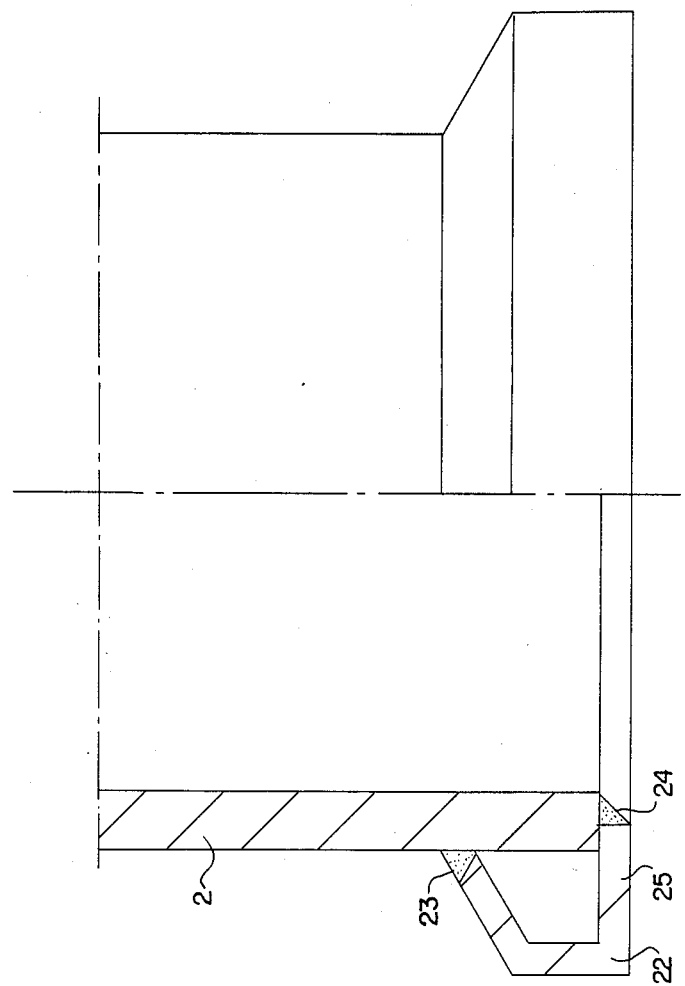
Figure 4:
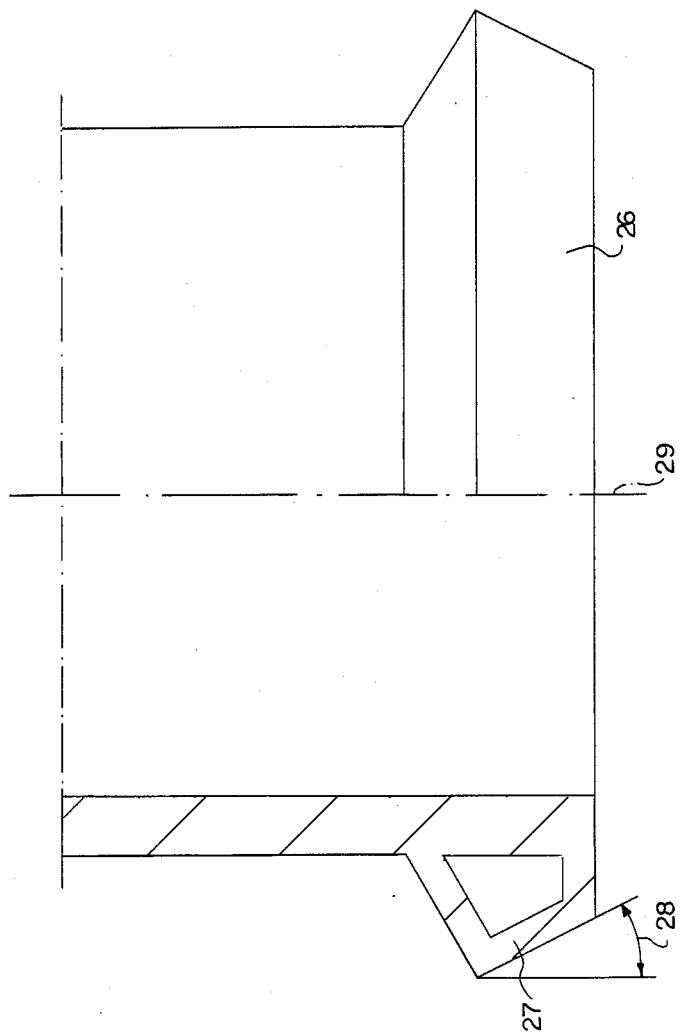
Figure 5:
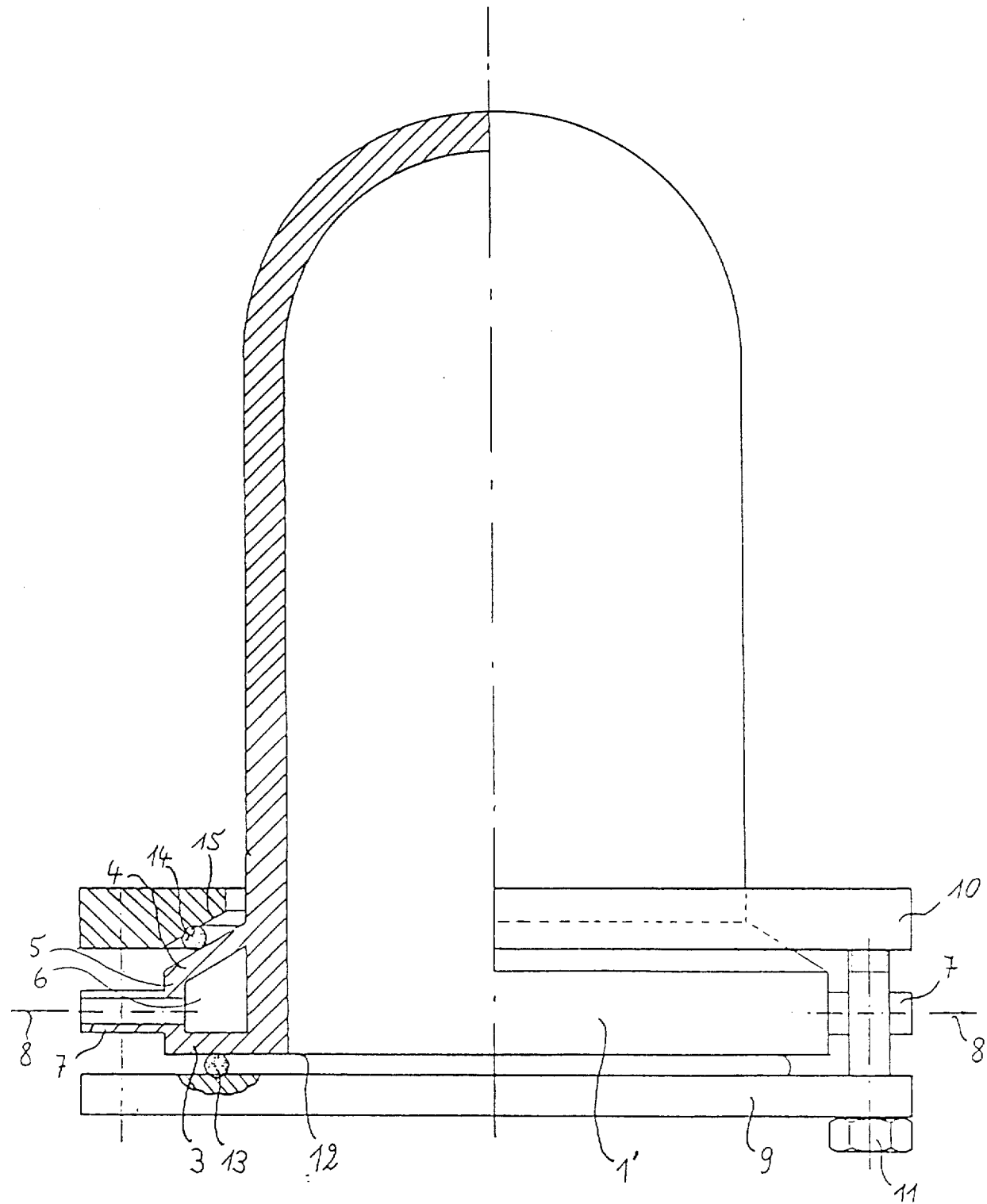

Further details and characteristics of the invention will be evident from the following description of one embodiment with references to the drawings, in which FIG. 1 illustrates one half of a tubular component with a flange in accordance with the invention and covered with a lid, FIG. 2 illustrates a U-shaped flange that is fused as a separate component in the wall of the tubular component, FIG. 3 illustrates a flange welded on to the end of the tubular component, FIG. 4 illustrates a different embodiment of the flange and FIG. 5 illustrates an embodiment wherein the tubular component is an exitaxy bell.

As will be evident from FIG. 1, a flange 1 positioned at the end of a tubular component 2 has an essentially U-shaped cross-section with two legs 3 and 4 and an area 5 that connects them. U-shaped flange 1 encloses in conjunction with the wall of tubular component 2 a hollow space 6, into and out of which a coolant 8, water or gas for example, is introduced and removed through a connection 7. The tubular component 2 illustrated in FIG. 2 is made out of quartz and sealed with a lid 9 by means of a tension ring 10 and tension screws 11. Between lid 9 and the sealing surface 12 of flange 1 and between tension ring 10 and the upper leg 4 is a sealing ring 13 and 14 respectively, an O ring in the present case. Since the upper leg 4 of flange 1 slopes toward the wall of flange 1 the hollow space 6 is wider toward tubular component 2 than at the outside. The constriction surface 15 of tension ring 10 is beveled to parallel the outer surface of leg 4.

The lower leg 17 of the flange 16 illustrated in FIG. 2 is longer than its upper leg 19, which slopes up to the wall 18 of the tube. The wall of the vessel in this case consists as in FIG. 1 of fused quartz with an inner wall surface 20 that is very massive, dense, and well fused to 2 to 3 mm deep, but otherwise contains many bubbles, typically 0.5 mm in diameter, in its outer region 21. To inactiviate the bubbles and in particular optimally seal off all of axial sealing surface 12 from sealing rings 13 and 14, the lower and longer leg 17 in this embodiment is drawn over the total face of tubular compenent 2.

The flange 22 illustrated in FIG. 3 is manufactured as a separate component and subsequently welded onto tubular component 2 with its legs at locations 23 and 24. At the face, leg 25, which constitutes the sealing surface, covers only the area of the face of the tubular component that essentially exhibits the bubbles.

The design illustrated in FIG. 4 corresponds essentially to that illustrated in FIG. 1. The connecting area 27 of the flange 26 employed in this embodiment, however, slopes at an angle 28 of about 25° from the axis of the tube, represented by the dot-and-dash line 29 toward the end and toward the inside of the tube.

In certain situations, when cooling with a fluid coolant is unnecessary, the hollow space 6 inside the flange can be packed with granulate or sand.

The flanges disclosed herein are especially appropriate for gas-phase epitaxy bells 1', shown in FIG. 5, which have high demands with respect to sealing properties.

What is claimed is:

1. In a tubular component made out of quartz glass or fused quartz having a flange fused or welded onto the tubular component, the improvement wherein the flange is composed of quartz glass or fused quartz and has at least two hollow spaces and is narrow-walled, the hollow spaces being fillable with a coolant, the tubular component having connections positionally at two diametrically opposite locations on the flange for introducing and removing the coolant, the connections being attached to said hollow spaces and wherein the walls of the flange are 4 to 10 mm thick.

2. The tubular component as in claim 1, wherein the flange is a component that is trough-shaped in cross-section.

3. The tubular component as in claim 2, wherein the flange has one longer and one shorter leg, with the longer leg at least to some extent overlapping the face of the tubular component and wherein both legs are connected tight to the tubular component.

4. The tubular component as in claim 3, wherein a wall that connects the two legs of the flange slopes toward the inside of the tubular component and toward one end of the the tubular component and wherein the flange is U-shaped.

5. The tubular component as in claim 4, wherein the connecting wall slopes toward the longitudinal axis of the tubular component at an angle of about 15° to 30°.

6. The tubular component as in claim 1, wherein the tubular component is a gas-phase epitaxy bell employed in heat-treating semiconductor substrates.

7. A tubular component as claimed in claim 1, wherein the flange further comprises a tension ring having a constriction surface which is beveled to more or less parallel an outer surface of an upper leg of the flange, the tension ring being connected to a lid, said lid serving to seal the tubular component.

8. A tubular component according to claim 1, wherein the hollow space is a quadralatral having no more thant wo sides being parallel to each other.

9. A tubular component according to claim 1, wherein the wall of the component is uniform in width.

* * * * *

UNITED STATES PATENT AND TRADEMARK OFFICE
CERTIFICATE OF CORRECTION

PATENT NO. : 4,778,202
DATED : October 18, 1988
INVENTOR(S) : Karl A. Schülke

It is certified that error appears in the above-identified patent and that said Letters Patent is hereby corrected as shown below:

| | |
|---|---|
| DRAWINGS | Insert "FIG. 5" after "FIG. 4" (as shown on attached sheet) |
| Title Page under "Foreign Priority Data" | Insert --Fed. Rep. of Germany P 34 26 379.9-45 July 18, 1984-- |
| Title Page under "U.S. Patent Documents" | line 2, correct spelling of --Hasche-- line 5 correct spelling of --Gingrich-- line 8 correct spelling of --Bennynck-- |
| Title Page under "Other Publications" | After "Q-C" insert --1/113--; after "Q-B" insert --3/113-- |
| Col. 1, line 65 | After "22" delete "Or" and substitute --or-- |
| Col. 4, line 39 | Delete "thant wo" and substitute --than two-- |

Signed and Sealed this

Eighth Day of August, 1989

Attest:

DONALD J. QUIGG

Attesting Officer

Commissioner of Patents and Trademarks